(12) United States Patent
Akaogi et al.

(10) Patent No.: US 6,351,420 B1
(45) Date of Patent: Feb. 26, 2002

(54) VOLTAGE BOOST LEVEL CLAMPING CIRCUIT FOR A FLASH MEMORY

(75) Inventors: Takao Akaogi, Cupertino; Ali K. Al-Shamma, San Jose; Lee Edward Cleveland; Yong Kim, both of Santa Clara; Jin-Lien Lin, Cupertino; Boon Tang Teh, Santa Clara; Kendra Nguyen, San Jose, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/595,519

(22) Filed: Jun. 16, 2000

Related U.S. Application Data

(60) Provisional application No. 60/180,638, filed on Feb. 7, 2000.

(51) Int. Cl.[7] .................................................. G11C 7/00
(52) U.S. Cl. .......................... 365/189.09; 365/189.06; 365/189.11; 365/226; 327/538
(58) Field of Search ....................... 365/189.09, 189.06, 365/226, 185.22, 185.23, 185.18, 189.11; 327/538, 539; 323/313, 314

(56) References Cited

U.S. PATENT DOCUMENTS

| 4,482,985 | A | | 11/1984 | Itoh et al. ..................... 365/226 |
|---|---|---|---|---|
| 5,184,035 | A | * | 2/1993 | Sugibayashi ................. 326/88 |
| 5,388,084 | A | * | 2/1995 | Itoh et al. ............... 365/185.23 |
| 5,530,640 | A | | 6/1996 | Hara et al. ..................... 363/60 |
| 5,537,073 | A | | 7/1996 | Arimoto ..................... 327/546 |
| RE35,313 | E | | 8/1996 | Hori et al. .................. 371/22.1 |
| 5,808,954 | A | * | 9/1998 | Ichikawa ..................... 365/226 |
| 5,903,498 | A | * | 5/1999 | Campardo et al. ...... 365/185.23 |
| 6,052,020 | A | * | 4/2000 | Doyle .......................... 327/539 |
| 6,134,146 | A | | 10/2000 | Bill et al. .............. 365/185.23 |

* cited by examiner

*Primary Examiner*—David Nelms
*Assistant Examiner*—Gene N. Auduong (57) ABSTRACT

A voltage boost circuit (111) for a flash memory (100) includes a boosting circuit (110), which is capable of boosting a portion of a power supply voltage ($V_{CC}$) of the flash memory to a word line voltage level adequate for accessing a core cell in a core cell array (102) of the memory. The voltage boost circuit further includes a balancing or clamping circuit (112) for providing a nonzero adjustment voltage ($V_{CL}$) to the boosting circuit to reduce the portion of the supply voltage that is available for boosting by the boosting circuit when the power supply voltage exceeds a certain value.

13 Claims, 6 Drawing Sheets

FIG. 6

VOLTAGE BOOST LEVEL CLAMPING CIRCUIT FOR A FLASH MEMORY

CROSS-REFERENCE TO RELATED APPLICATION

This application claims the benefit under 35 U.S.C. §119 (e) of the U.S. provisional application Ser. No. 60/180,638, filed on Feb. 7, 2000.

BACKGROUND

The present invention relates generally to semiconductor memory devices. More particularly, the present invention relates to a voltage boost level clamping circuit for a flash memory.

In the design of integrated circuits, there is a trend to power the integrated circuits using decreasing power supply voltage levels. Previous circuit families operated at 5 volts and 3.3 volts. Current families operate at 1.8 volts and future families will operate at or below 1.0 volts nominal supply voltage, for example at 0.8 volts. These lower power supply voltages create design and operation challenges.

One design challenge relates to accessing a storage element or core cell of the memory device. The voltage swing available in low supply voltage systems such as a 1.0 volt supply system is typically insufficient for a read or a program of a flash memory cell. Accordingly, boost circuits have been developed to provide the necessary voltage variation. For accessing the core cell, a word line voltage is boosted to, for example, 3.2 volts. This allows the core cell transistor to fully turn on and the core cell to sink enough current for rapid sensing of the state of the cell by the sensing circuitry.

A high boosted voltage is generally required in a low supply voltage system such as a 1.0 volt supply system. In order to generate this high boosted voltage, a multi-stage booster circuit can be used with an effective boost ratio. However, the effective boost ratio characteristic is substantially linear and for a supply voltage higher than a certain value, the effective boost ratio yields a boosted voltage that is higher than desired.

The approximate range of supply voltage presented to a chip or a memory device can vary depending on the application. Of course, supply voltages can also vary over the lifetime of a device as well. In many flash memory applications, for example, batteries are often utilized to provide a power supply. The supply voltage presented to a memory device by a battery can decline with time and usage, yet consistent performance at all stages of use is desirable.

It would be desirable to provide a method or apparatus to prevent boosted voltages from becoming too large in size. It would also be desirable to utilize booster circuits responsive to a flexible range of voltages while still achieving desired performance.

SUMMARY

By way of introduction only, an embodiment of a voltage boost circuit for a flash memory is presented. The voltage boost circuit includes a boosting circuit to boost a portion of a supply voltage of the flash memory to a word line voltage level adequate to access a core cell of the memory. The voltage boost circuit further includes a balancing circuit to provide a nonzero adjustment voltage to the boosting circuit to reduce the portion of the supply voltage that is available for boosting by the boosting circuit when the supply voltage exceeds a certain value.

An embodiment of a voltage clamping circuit for a memory for use in conjunction with a voltage boost circuit for boosting a supply voltage is presented. The voltage clamping circuit includes a feedback loop that further includes a first transistor that has a threshold voltage that serves as a clamping voltage. The feedback loop additionally includes pull up and pull down transistors coupled to the first transistor to stabilize the feedback loop to provide a stable voltage to the voltage boost circuit. The stable voltage reduces the portion of the supply voltage that is available for boosting by the boosting circuit.

An embodiment of a voltage boost circuit for a memory is also presented. The voltage boost circuit includes a boosting circuit and a clamping circuit. The boosting circuit is coupled to a boosted node to boost a word line voltage to access a core cell of the memory. The clamping circuit is coupled to the boosting circuit, and includes a threshold voltage clamping transistor to clamp the boosted node to a desired voltage.

Also presented is an embodiment of a memory, including a core cell array, an address decoder, a boosting circuit, and a balancing circuit. The address decoder is configured to activate one or more word lines of a plurality of word lines. Each word line of the plurality of word lines is associated with one row of the core cell array. The boosting circuit is configured to boost a portion of a supply voltage of the memory to produce a boosted voltage on a boosted node coupled to the address decoder. The address decoder responds to the boosted voltage by boosting the word line voltage of one of the one or more word lines upon activation to a boosted voltage suitable to access a core cell of the core cell array. The balancing circuit is coupled to the boosting circuit and provides a nonzero adjustment voltage to the boosting circuit to reduce the portion of the supply voltage that is available for boosting by the boosting circuit when the supply voltage exceeds a certain value.

An embodiment of a method, for use in a memory, of clamping a boosted voltage to an acceptable level is presented. An adjustment voltage is generated with a balancing circuit. A portion of a power supply voltage of the memory is boosted to a boost voltage with a voltage boost circuit. The boost voltage is clamped to an acceptable level by utilizing the adjustment voltage to reduce the portion of the power supply voltage that is available for boosting.

Another embodiment of a voltage boost circuit for a memory is presented. The voltage boost circuit includes a means for boosting a portion of a supply voltage of the memory to a boost voltage. The voltage boost circuit also includes a means for generating an adjustment voltage. The voltage boost circuit further includes a means for clamping the boost voltage utilizing the adjustment voltage.

The foregoing discussion of a series of the presently preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

In the design of integrated circuits, there is a trend to power the integrated circuits using decreasing supply voltage levels. Previous circuit families operated at 5 volts and 3.3 volts. Current families operate at 1.8 volts and future families will operate at or below 1.0 volts nominal supply voltage, for example at 0.8 volts. These lower supply voltages create design and operation challenges.

One design challenge relates to accessing a core cell of the memory device. The core cell is the data storage element of the memory device. The voltage swing available in low supply voltage systems such as a 1.0 volt supply system is typically insufficient for a read or a program of a flash memory cell. Accordingly, boost circuits have been developed to provide the necessary voltage variation. Four accessing the core cell, a word line voltage is boosted to, for example, 3.2 volts. This allows the core cell transistor to fully turn on and the core cell to sink enough current for rapid sensing of the state of the cell by the sensing circuitry.

A high boosted voltage is generally required in a low supply voltage system such as a 1.0 volt supply system. In order to generate this high boosted voltage, a multi-stage booster circuit can be used with an effective boost ratio.

Figure 1:
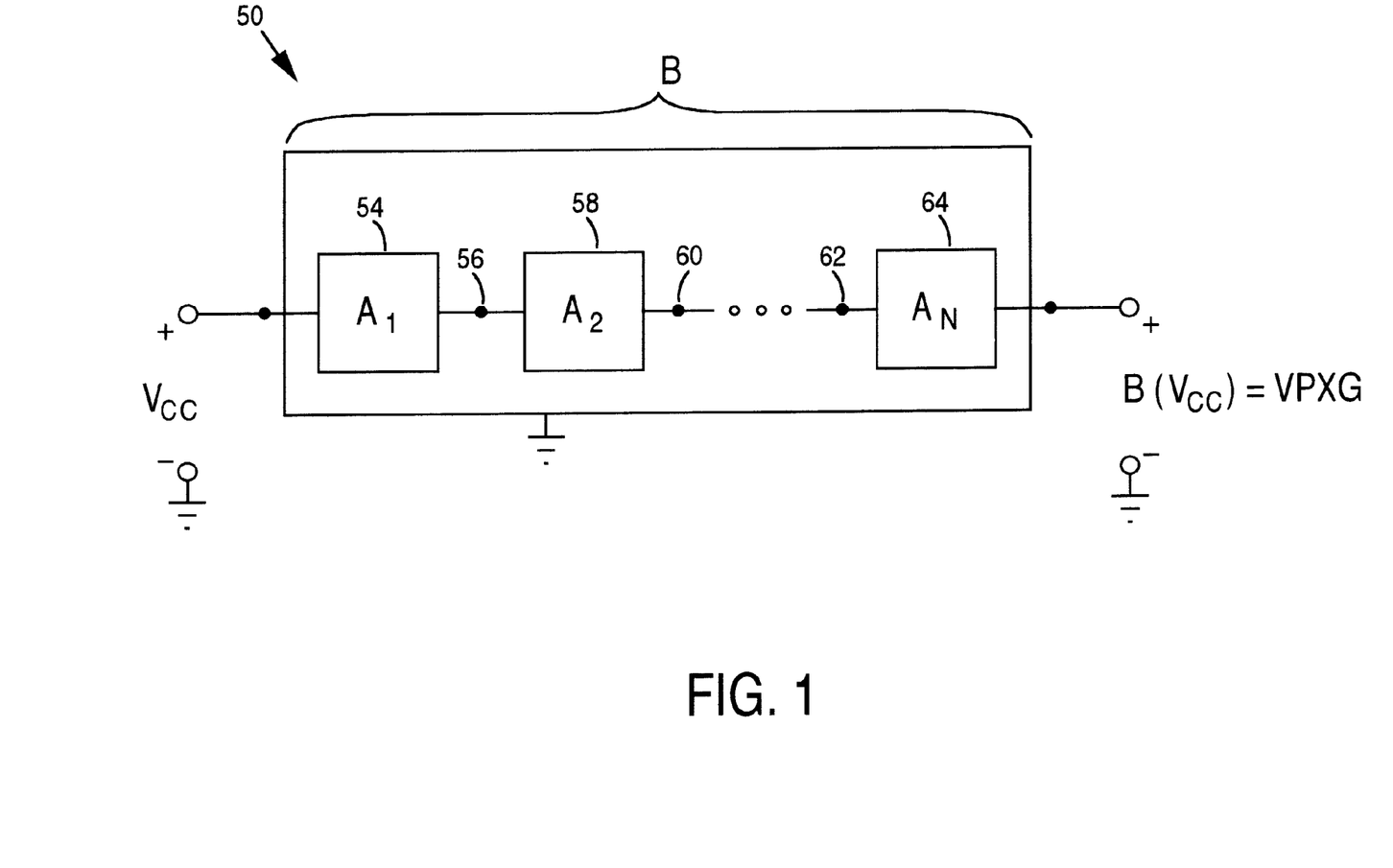
FIG. 1 is a block diagram of a simplified voltage boosting circuit.

FIG. 1 illustrates a simplified embodiment of a voltage boosting circuit 50 having N stages and an effective Boost Ratio B. A supply voltage $V_{CC}$ is received at a node 52 by a first booster stage $A_1$ 54 which propagates a voltage via node 56 to a second booster stage $A_2$ 58. The second booster stage $A_2$ 58 propagates a voltage via node 60 across intermediate booster stages, if any, to a node 62 at a last booster stage $A_N$ 74 to yield a boosted voltage VPXG. This boosted voltage can be expressed in simplified terms as:

$$VPXG=V_{CC}*(A_1*A_2* \ldots *A_N)=V_{CC}*(B)$$

where B is (as above) the effective Boost Ratio. The effective Boost Ratio can be chosen according to the value of the boosted voltage VPXG that is required or desired for boosting. For example, assume that a VPXG of 3.2 volts is desired or required in a particular application having a supply voltage $V_{CC}$ of 0.8 volts. In this case, the effective Boost Ratio B can be selected to have a value that is approximately equal to four.

$$VPXG=3.2 \text{ V}=V_{CC}*B=(0.8 \text{ V})*(4)$$

By inspection, the relationship of $V_{CC}$ to VPXG by the effective Boost ratio B is substantially linear. It happens that for a supply voltage higher than a certain value, the effective boost ratio yields a boosted voltage that is higher than desired. For example, assuming $V_{CC}$ is approximately equal to 1.3 volts using the same booster circuit with an equivalent effective boost ratio B, then the boosted voltage VPXG will be 5.2 volts, which may be too high for core cell sensing circuitry.

$$V_{CC}*B=(1.3 \text{ V})*(4)=VPXG=5.2 \text{ V}.$$

Whether the boosted voltage VPXG will be too high will depend on the particular circuitry that is being utilized. In a flash memory device that utilizes a 0.8 volt supply voltage $V_{CC}$, a boosted voltage of 4.0 volts might even be too high for certain circuitry such as core cell current sensing circuitry. In sum, variations in the supply voltage VCC may cause boosting to unacceptably high level of boosted voltages.

The approximate range of supply voltage presented to a chip or a memory device can vary depending on the application. Of course, supply voltages can also vary over the lifetime of a device as well. In many flash memory applications, for example, batteries are utilized to provide a power supply. The supply voltage presented to a memory device by a battery can decline with time and usage, yet consistent performance at all stages of use is desirable. For example, at the beginning of its lifetime in use the battery voltage might me relatively high (1.2 volts), while at the end of its lifetime in use it might be lower (0.8 volts, for example). Yet the memory device must continue to perform properly throughout the device lifetime.

Figure 2:
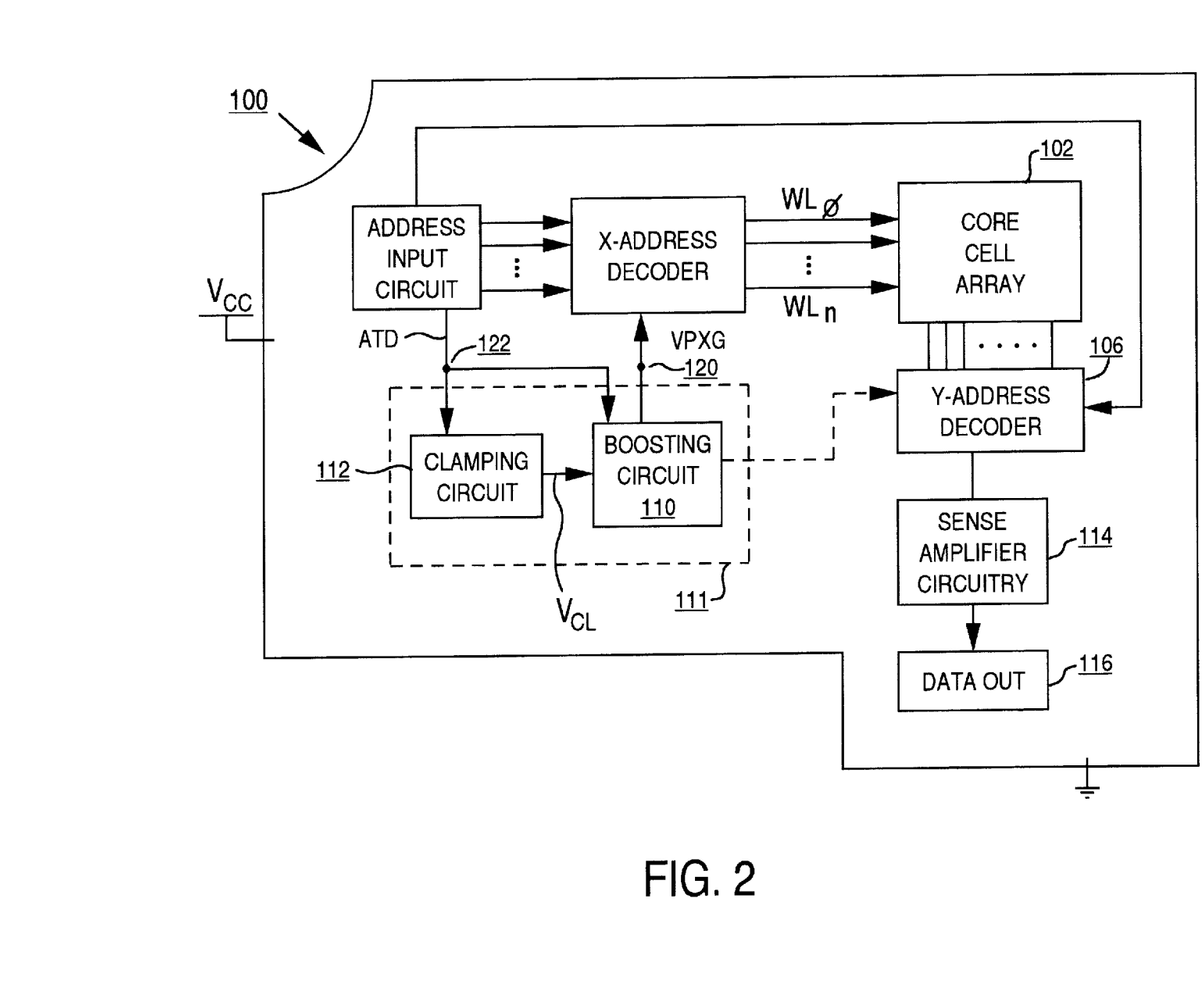
FIG. 2 is a block diagram of a memory.

Referring now to FIG. 2, it shows a block diagram of a Memory 100. In the illustrated embodiment, the Memory 100 is configured as a flash memory formed as a complementary metal-oxide-semiconductor (CMOS) integrated circuit for storing digital data. However, the Memory 100 may take any other suitable form and in fact the principles described herein may be applied in any other suitable circuit in which limiting or clamping the value of voltage at a particular node is necessary or desirable for varying or improving operation of the circuit. The Memory 100 includes a Core Cell Array 102, a Row or X-Address Decoder 104, a Column or Y-Address Decoder 106, an Address Input Circuit 108, a Boost Circuit 111, Sense Amplifier Circuitry 114 and Data Out Circuit 116. The Boost Circuit 111 further includes a Boosting Circuit 110 and a Voltage Level Clamping Circuit 112 (Clamping Circuit).

In FIG. 2 the Clamping Circuit 112 is shown to be external to the Boosting Circuit 110. The Clamping Circuit 112 is not limited to this arrangement. In other embodiments, the Clamping Circuit 112 is internal to the Boosting Circuit 110. Likewise, in FIG. 2 the Clamping Circuit 112 is illustrated as internal to the Boost Circuit 111. The Clamping Circuit 112 is not limited to this arrangement. In other embodiments, the Clamping Circuit 112 is external to the Boost Circuit 111 and can be connected to one or more additional boost circuits (not illustrated in FIG. 2).

The Core Cell Array 102 includes a plurality of core cells, each configured to store data. In some applications, each core cell may store a single bit of data; in other applications, each core cell may store two or more bits of data. Each core cell of the Core Cell Array 102 is accessed by providing a corresponding cell address at the Address Input Circuit 108. Each core cell has a unique address, which is decoded by the X-Address Decoder 104 and the Y-Address Decoder 106.

In general, the X-Address Decoder 104 responds to an address input signal provided from the Address Input Circuit 108 by activating one word line of a plurality of word lines labeled WL0 through WLn in FIG. 2. Each word line is associated with one row of the Core Cell Array 102. In response to activation of the word line, core cells associated with that word line turn on and begin sinking current. To adequately turn on the core cells, the word line must be varied by a substantial potential difference, such as 3.0 to 4.0 V.

The Y-Address Decoder 106 couples the appropriate column of the Core Cell Array 102 to the Sense Amplifier Circuitry 114. The Y-Address Decoder 106 responds to an address from the Address Input Circuit 108 to decode the selected column from among a plurality of columns of the Core Cell Array 102. The Sense Amplifier Circuitry 114 senses the current in the selected core cell of the Core Cell Array 102 and determines the binary state of the one or more bits of data stored in the selected core cell. The Data Out Circuit 116 provides the core cell data that are sensed by the Sense Amplifier Circuitry 114 at the output of the Memory 100 for use external to the Memory 100. Other circuitry, not shown in FIG. 2, provides for programming, reading, verifying, erasing, and performing other operations as necessary on the individual core cells of the Core Cell Array 102.

The Memory 100 operates in response to a supply voltage, labeled $V_{CC}$ in FIG. 2. The potential difference between $V_{CC}$ and ground is the supply voltage and may be in the range 0.8 to 3.3 volts. The suitability of the supply voltage $V_{CC}$ will depend on a variety of factors, including the technology with which the Memory 100 is fabricated. In general, in advanced CMOS processes, the supply voltage will nominally be 0.8 volts. In absolute terms, this voltage is less than or comparable to the magnitude of the "turn-on," or threshold voltage $V_{tp}$ for p-channel transistors of −0.9 volts and the turn-on or threshold voltage $V_{tn}$ for n-channel transistors of +1.0 volts.

In the embodiment of FIG. 2, the Memory 100 may be operated at low supply voltages such as 0.8 volts. At such low supply voltage levels, some circuitry will not work well or at all. In particular, the core cell array 102 requires a substantial variation on the word line voltage in order to access each core cell properly.

In order to vary the word line voltage adequately, the Memory 100 includes a Boost Circuit 111 including a Boosting Circuit 110 and a Clamping Circuit 112. The Boosting Circuit 110 produces a boosted voltage on a boosted node 120 coupled to the X-Address Decoder 104. In FIG. 2, the boosted node 120 is labeled VPXG. The X-Address Decoder 104 responds to the boosted voltage by boosting the word line voltage of an activated word line upon activation to a boosted voltage suitable for accessing a core cell of the Core Cell Array 102. For example, the Boosting Circuit 110 might increase the voltage on the boosted node 120 by substantially 3.0 to 4.0 volts.

The Clamping Circuit 112 receives an address transition detect (ATD) signal on node 122 (also labeled ATD) from the Address Input Circuit 108. In response to a variation of one or more of the address inputs provided to the Memory 100, the address transition detection signal goes to an active level (usually a logic "high," or logic "1" value) for some duration.

The Clamping Circuit 112 responds to the ATD signal to prevent the boosted voltage VPXG at the boosted node 120 from becoming too large. That is, the Clamping Circuit 112 controls the limiting or clamping of the value of the boosted voltage.

Figure 3:
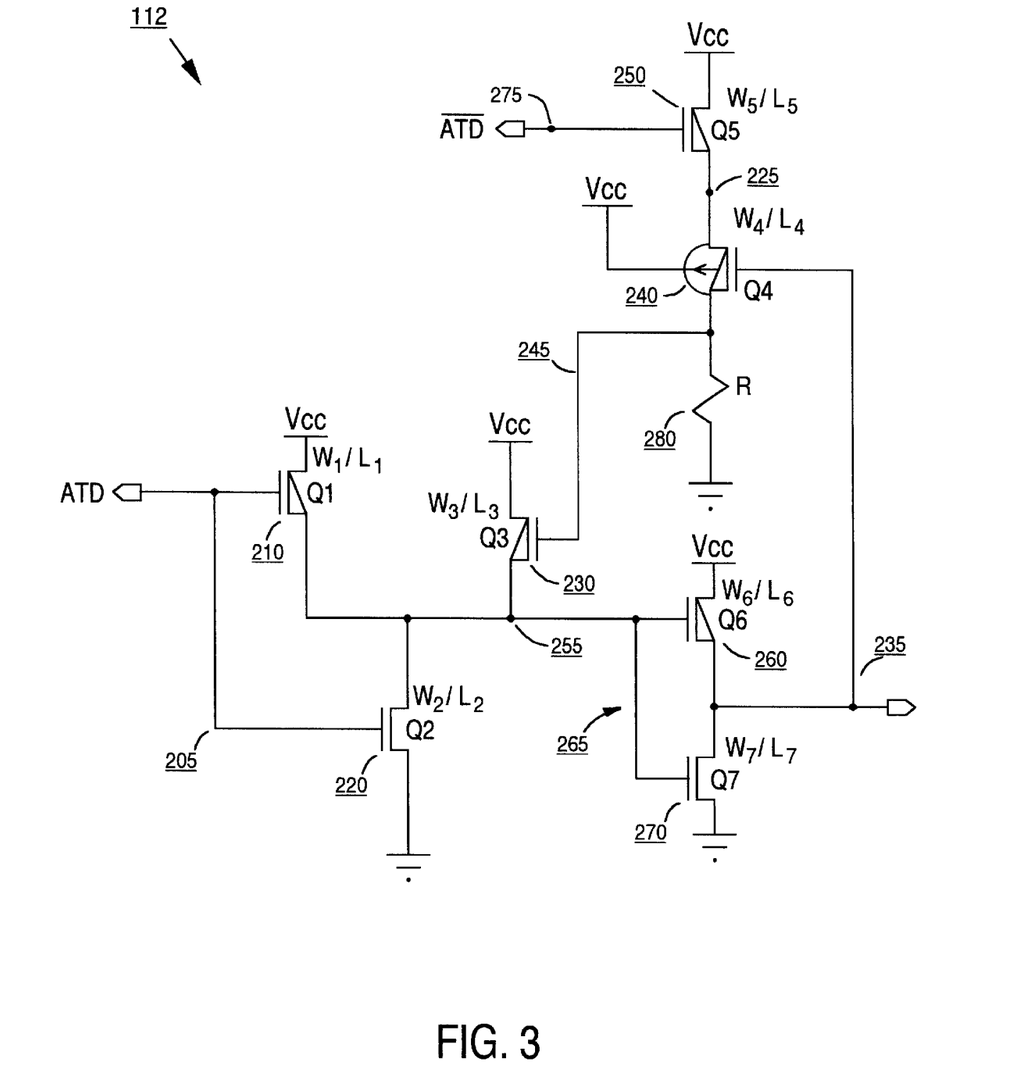
FIG. 3 is a block diagram of a clamping circuit for use in the memory of FIG. 2.

FIG. 3 is a circuit diagram illustrating the Clamping Circuit 112 of FIG. 2. The Clamping Circuit 112 includes a transistor Q1 210, a transistor Q2 220, a transistor Q3 230, a transistor Q4 240 having a unique selected threshold voltage $V_{clamp}$, a transistor Q5 250, a gate 265 formed by a pair of transistors Q6 260 and Q7 270, and a resistor R 280.

Transistors 210, 220, 230, 240, 250, 260, and 270 have device sizes indicated by the subscripted variables W and L in the schematic diagram of FIG. 3. Exemplary device sizes for a presently preferred exemplary and useful embodiment of the Clamping Circuit 112 of FIG. 3 are shown in Table 1.

TABLE 1

Exemplary Threshold Voltage Ranges and Device Sizes for an Embodiment of the Clamping Circuit 112 of FIG. 3

| Device/ Transistor | Type | Threshold Voltage (V) | Exemplary Width ($\mu$m) | Exemplary Length ($\mu$m) |
| --- | --- | --- | --- | --- |
| Q1 210 | PMOS "Low" Threshold Transistor | $V_{tp1} \approx -0.5$ V | $W_1 = 38$ | $L_1 = 0.4$ |
| Q2 220 | NMOS | $V_{tn2} \approx 1.0$ V | $W_2 = 5$ | $L_2 = 1.5$ |
| Q3 230 | PMOS "Low" Threshold Transistor | $V_{tp3} \approx -0.5$ V | $W_3 = 10$ | $L_3 = 0.6$ |
| Q4 240 | PMOS | $V_{tp4} \approx -0.8$ V = $V_{clamp}$ | $W_4 = 100$ | $L_4 = 0.8$ |
| Q5 250 | PMOS "Low" Threshold Transistor | $V_{tp5} \approx -0.5$ V | $W_5 = 100$ | $L_5 = 0.4$ |
| Q6 260 (Gate 265) | PMOS "Low" Threshold Transistor | $V_{tp6} \approx -0.5$ V | $W_6 = 300$ | $L_6 = 0.4$ |
| Q7 270 (Gate 265) | NMOS | $V_{tn7} \approx 1.0$ V | $W_7 = 750$ | $L_7 = 0.4$ |
| R 280 | Resistor $\approx 9$ k$\Omega$ | N/A | N/A | N/A |

PMOS: p-channel MOSFET
NMOS: n-channel MOSFET

It should be understood that the threshold voltages and device sizes presented in Table 1 with reference to FIG. 3 are exemplary only. Other device sizes, circuit configurations, or applicable techniques available to those skilled the art may be used or substituted where suitable.

The ATD signal is presented to node 205. In a useful embodiment, node 205 of FIG. 3 will be the same node as node 122 of FIG. 2. It should be understood, however, that node 205 and node 122 need not be the same, and circuitry, devices, and/or logic elements can be implemented between nodes 205 and 122. A complement of the ATD signal, $\overline{\text{ATD}}$, is presented to node 275.

The circuitry necessary for generating the complement of the ATD signal, $\overline{\text{ATD}}$, is not shown in FIG. 3. However, such circuitry may be readily devised by those ordinarily skilled in the art. In an exemplary embodiment, the ATD signal comprises a pulse of predetermined duration generated after a transition of any of the address signals received at the memory device 100.

Moreover, it should be understood that the complement of the ATD signal, $\overline{\text{ATD}}$, can be generated in any number of ways known to those skilled in the art. For example, a latch or flip-flop arrangement or similar functional logic circuit (not illustrated in FIG. 3) can be implemented to provide a particular signal output and its complement under a variety of conditions. A less complex solution is to provide an inverted and non-inverted version of a signal by utilizing an inverter, such as a CMOS (complementary MOS) inverter as known to those skilled in the art.

The transistor Q1 210 has a gate coupled to the node 205 for receiving the ATD signal, a source coupled to the supply voltage $V_{CC}$, and a drain coupled to a node 255. The transistor Q1 210 has width $W_1$ and length $L_1$ as shown in FIG. 3. The transistor Q1 210 is a p-channel transistor and, more particularly, is a low threshold voltage transistor, as indicated by the diagonal line drawn through its symbol in FIG. 3. In an exemplary embodiment, the transistor Q1 210 has a nominal threshold voltage of approximately −0.5 volts. This threshold voltage is considerably smaller than the threshold voltages of conventional p-channel transistors, which are typically −1.2 volts.

The transistor Q2 220 has a gate coupled to the node 205 for receiving the ATD signal, a source coupled to ground potential, and a drain coupled to the node 255. The transistor Q2 220 has width $W_2$ and length $L_2$ as shown in FIG. 3. The transistor Q2 220 is a conventional n-channel transistor. In an exemplary embodiment, the transistor Q2 220 has a threshold voltage of approximately 1.0 volts.

The ATD signal at the node 205 controls the gates of the transistors Q1 210 and Q2 220. Low threshold p-channel transistor Q1 210 operates as a voltage-controlled switch between the supply voltage $V_{CC}$ and node 255. When conducting (i.e. when the switch closes), Q1 210 will act to "pull up" node 255 toward $V_{CC}$. N-channel transistor Q2 220 operates as a voltage-controlled switch between ground potential and node 255. When conducting, Q2 220 will act to "pull down" node 255 toward ground potential.

The complement of the ATD signal, $\overline{ATD}$, is presented to node 275. The transistor Q2 250 has a gate coupled to the node 275 for receiving the $\overline{ATD}$ signal, a source coupled to the supply voltage $V_{CC}$, and a drain coupled to the transistor Q4 240 at node 225. The transistor Q2 250 has width $W_5$ and length $L_5$ as shown in FIG. 3. The transistor Q2 250 is a p-channel transistor and, more particularly, is a low threshold voltage transistor, as indicated by the diagonal line drawn through its symbol in FIG. 3. In an exemplary embodiment, the transistor Q2 250 has a threshold voltage of approximately −0.5 volts. This threshold voltage is considerably smaller than the threshold voltage of conventional p-channel transistors, which are typically −1.2 volts.

The $\overline{ATD}$ signal at the node 275 controls the gate of the transistor Q5 250. Low threshold p-channel transistor Q2 250 operates as a voltage-controlled switch between the supply voltage $V_{CC}$ and node 225. When conducting (i.e. when the switch closes), Q2 250 will act to "pull up" node 225 toward $V_{CC}$.

The transistor Q4 240 has a source coupled to the transistor Q2 250 at node 225, a gate coupled to the node 235 for receiving a voltage signal $V_{CL}$, a drain coupled to a node 245, and a substrate (or bulk) and an n-well coupled to the supply voltage $V_{CC}$. The transistor Q4 240 has width $W_4$ and length $L_4$ as shown in FIG. 3. The transistor Q4 240 is a p-channel transistor and, more particularly, is a low threshold voltage transistor, as indicated by the diagonal line drawn through its symbol in FIG. 3. In an exemplary embodiment, the transistor Q4 240 has a threshold voltage of approximately −0.8 volts. This exemplary threshold voltage is smaller than the threshold voltage of conventional p-channel transistors, which are typically −1.2 volts.

It is well known to those skilled in the art that the threshold voltages of transistors such as MOSFETs are controlled during fabrication. The device fabrication process allows some flexibility in selecting the threshold voltage. However, normal values prevail and are in common usage for MOSFETs in particular processes. In the case of Q4 240, the threshold voltage $V_{tp4}$ is the clamping voltage $V_{clamp}$ for the Clamping Circuit 112, the Boosting Circuit 110, and the Boost Circuit 111. Preferably, the clamping voltage $V_{clamp}$ determines the voltage at which the clamping effect begins to occur during voltage boosting. The value of threshold voltage $V_{tp4}$ is specifically prescribed during fabrication to match a desired value for the clamping voltage $V_{clamp}$. It is in this sense that the clamping voltage $V_{clamp}$ and the equivalent threshold voltage $V_{tp4}$ are unique relative to the other transistors in the Clamping Circuit 112. In the strict sense, $V_{clamp}$ is defined as equivalent to the absolute value of threshold voltage $V_{tp4}$ of the transistor Q4 240 or $$V_{clamp}=|V_{tP4}|.$$

It should be understood that, aside from the "special" value of the threshold voltage $V_{tp4}$, the fabrication process used to make the transistor Q4 240 and the transistor Q4 240 itself are not particularly unique. Further, it is to be understood that all threshold voltages described herein will vary with temperature and other conditions and with process variations. The values described herein are nominal only.

The transistor Q4 240 will in general conduct if the gate to source voltage of Q4 240 is more negative than the threshold voltage $V_{tp4}$ (i.e., the clamping voltage $V_{clamp}$) of Q4 240. In this way, the voltage signal $V_{CL}$ at the node 235 partially controls the gate of the transistor Q4 240. Likewise, the supply voltage $V_{CC}$ can influence whether or not the transistor Q4 240 turns on. For example, if transistor Q2 250 is on or conducting, then node 225 is approximately at $V_{CC}$. If $V_{CC}$ is less in absolute terms than the threshold voltage $V_{tp4}$ (i.e., the clamping voltage $V_{clamp}$) of Q4 240, for example if $V_{CC}$ is 0.7 V and $V_{tp4}=V_{clamp}=-0.8$ V, then for both extremes of $V_{CL}$ (i.e. VCC<VCL<0 V) the transistor Q4 240 is off:

$$V_{GS}=V_{CL}-V_{CC}<V_{tp4}=V_{clamp} \text{ to turn on Q4 240}$$

$$V_{GS}(V_{CL=0\ V})=0-0.7\ V=-0.7\ V>-0.8\ V \therefore Q4\ 240\ \text{is off}$$

$$V_{GS}(V_{CL}=V_{CC})=0.7V-0.7\ V=0\ V>-0.8\ V \therefore Q4\ 240\ \text{is off.}$$

If $V_{CC}$ is greater in absolute terms than the threshold voltage $V_{tp4}$ (clamping voltage $V_{clamp}$) of Q4 240, then Q4 240 will be on or conducting for $V_{CL}$ approximately less than $V_{CC}$ plus $V_{tp4}$. Generally speaking, if Q4 240 is capable of conducting (i.e., if $V_{CC}>|V_{tp4}|$), then Q4 240 will conduct if $V_{CL}$ is approximately at ground potential (or "low").

The resistor 280 is connected between the node 245 and ground potential and is coupled to the gate of Q3 230 as well as the drain of Q4 240 at node 245. In a useful embodiment, the resistor 280 has resistance R of substantially 9 kΩ. It should be understood that the resistor 280 is not limited to this exemplary value, and other values can be used. The resistor 280 can be constructed in any suitable manner, just as by doping silicon or polysilicon or by appropriately biasing a transistor or other active device. The resistor 280 serves the purpose in the Clamping Circuit 112 of FIG. 3 of pulling node 245, or the gate of transistor Q3 230, down toward ground potential when transistor Q4 240 is not on or is not conducting.

The transistor Q3 230 has a source coupled to the supply voltage $V_{CC}$, a gate coupled to the transistor Q4 240 and the resistor 280 at node 245, and a drain coupled to node 255 including the gates of the transistors Q6 260 and Q7 270. The transistor Q3 230 has width $W_3$ and length $L_3$ as shown in FIG. 3. The transistor Q3 250 is a p-channel transistor and, more particularly, is a low threshold voltage transistor, as indicated by the diagonal line drawn through its symbol in FIG. 3. In an exemplary embodiment, the transistor Q3 250 has a threshold voltage of approximately −0.5 volts. This threshold voltage is considerably smaller than the threshold voltage of conventional p-channel transistors, which are typically −1.2 volts.

The transistor Q4 240 and the resistor 280 at node 245 control the gate of the transistor Q3 230. Low threshold p-channel transistor Q3 230 operates as a voltage-controlled switch between the supply voltage $V_{CC}$ and node 230. When conducting (i.e. when the switch closes), Q3 230 will act to "pull up" node 255 toward $V_{CC}$.

The transistor Q6 260 has a source coupled to the supply voltage $V_{CC}$, a gate coupled to the node 255 (and the drains of Q1 210, Q2 220, and Q3 230) and tied to the gate of Q7 270, and a drain tied to the drain of Q7 270 at the node 235 to produce the voltage signal $V_{CL}$. The transistor Q6 260 has width $W_6$ and length $L_6$ as shown in FIG. 3. The transistor Q6 260 is a p-channel transistor and, more particularly, is a low threshold voltage transistor, as indicated by the diagonal line drawn through its symbol in FIG. 3. In an exemplary embodiment, the transistor Q6 260 has a threshold voltage of approximately −0.5 volts. This threshold voltage is considerably smaller than the threshold voltage of conventional p-channel transistors, which are typically −1.2 volts.

Similarly to transistor Q6 260, the transistor Q7 270 has a source coupled to ground potential, a gate coupled to the node 255 (and the drains of Q1 210, Q2 220, and Q3 230) and tied to the gate of Q6 260, and a drain tied to the drain of Q6 260 at the node 235 to produce the voltage signal $V_{CL}$. The transistor Q7 270 has width $W_7$ and length $L_7$ as shown in FIG. 3. The transistor Q7 270 is a conventional n-channel transistor. In an exemplary embodiment, the transistor Q7 270 has a threshold voltage of approximately 1.0 volts.

The drains of transistors Q1 210, Q2 220, and Q3 230 at the node 255 control the gates of the transistors Q6 260 and Q7 270. In general, as node 255 is "pulled" up (down) or tends toward a logical high value (logic low value) then node 235 is pulled down (up) or tends toward a logical low value (logic high value). In this way, the transistors Q6 260 and Q7 270 together form the gate 265 that performs similarly to an inverter stage.

Overall Operation of Clamping Circuit 112

It should be understood that while the Clamping Circuit 112 of FIG. 3 is an analog circuit, the operation of the circuit can be described with reference to digital terminology. For example, a node that is "low," or "goes low," or is "pulled low," or "swings low," is approaching ground potential or at the very least is declining in voltage measured relative to ground potential. Likewise a node that is "high" or is "goes high," or is "pulled high," or "swings high," for example, is approaching the supply voltage $V_{CC}$ or at the very least is increasing in voltage measured relative to the ground potential.

Case I: When ATD is low; VCL is low

When the ATD signal goes low, then the node 205 goes low, the transistor Q2 210 turns off or does not conduct, and the transistor Q1 210 turns on and conducts strongly so that the node 255 is pulled high toward $V_{CC}$. Meanwhile, as the ATD signal goes low, the $\overline{ATD}$ signal goes high and the node 275 goes high. In this case, the transistor Q2 250 (and thus the transistor Q4 240) will turn off and will not conduct. Consequently, the Resistor 280 will pull the node 245 low toward ground potential so that the transistor Q3 230 turns on and conducts strongly, sustaining node 255 as it goes high to $V_{CC}$.

The node 255 goes high at the gates of the transistors Q6 260 and Q7 270. As a result, the transistor Q6 260 turns off or does not conduct and the transistor Q7 270 turns on and conducts so that the voltage $V_{CL}$ at the node 235 is pulled low, toward ground potential. In this instance, i.e., when ATD is low, VCL will not affect the Boosting Circuit 110 or an effective Boost Ratio of the Boosting Circuit 110.

Case II: When $V_{CC}<|V_{tp4}|=V_{clamp}$

As discussed in more detail above, when the supply voltage $V_{CC}$ is less in absolute terms than the threshold voltage $V_{tp4}$ (the clamping voltage $V_{clamp}$) of the transistor Q4 240, then the transistor Q4 240 will never turn on, regardless of the value of the voltage $V_{CL}$ at the node 235.

However, because the transistor Q4 240 is always off, the voltage $V_{CL}$ at the node 235 will always be low or at ground potential. This is evident from investigation of the exemplary embodiment of FIG. 3.

The transistor Q4 240 is always off and the Resistor 280 pulls the node 245 toward ground potential so that the transistor Q3 230 is on and conducts strongly, bringing node 255 to $V_{CC}$.

With the node 255 at $V_{CC}$, the transistor Q6 260 is off and the transistor Q7 270 conducts so that the voltage $V_{CL}$ at the node 235 is at ground potential. In this instance, i.e., when the supply voltage $V_{CC}$ is less in absolute terms than the threshold voltage $V_{tp4}$ (the clamping voltage $V_{clamp}$) of the transistor Q4 240, VCL will not affect the Boosting Circuit 110 or an effective Boost Ratio of the Boosting Circuit 110.

Case III: When ATD is high; When $V_{CC}>|V_{tp4}|=V_{clamp}$

When the ATD signal goes high, then the node 205 goes high, the transistor Q1 210 turns off or does not conduct, and the transistor Q2 220 turns on and conducts strongly so that the node 255 is pulled down toward ground potential. Meanwhile, as the ATD signal goes high, the $\overline{ATD}$ signal goes low and the node 275 goes low. In this case, the transistor Q2 250 turns on, since $\overline{ATD}-V_{CC}$ (i.e., the gate-to-source voltage of Q5 250) is more negative than the threshold voltage $V_{tp5}$, which is approximately −0.5 volts in an exemplary embodiment. The node 225 will be pulled up high to $V_{CC}$ as the transistor Q2 250 conducts.

Before $V_{CC}$ is greater than $|V_{tp4}|=V_{clamp}$, the transistor Q4 240 is off as in Case II (except that here ATD is high), the node 245 is low, and the transistor Q3 230 is on, conducting strongly so that the node 255 feels a pull up toward $V_{CC}$. This is in contrast to the pull down toward ground potential on node 255 due to transistor Q2 220 conducting with ATD high.

When $V_{CC}$ goes greater than $|V_{tp4}|=Vclamp$, assuming that the voltage $V_{CL}$ at the node 235 is at around potential as in Cases I and II, then the transistor Q4 240 will turn on, since $V_{CL}-V_{CC}$ (i.e., the gate-to-source voltage of Q4 240) is more negative than the threshold voltage $V_{tp4}$, which is approximately −0.8 volts in an exemplary embodiment. The node 245 will be pulled higher as the transistor Q4 240 conducts along with Q2 250 and the voltage across the Resistor 280 increases toward $V_{CC}$. As the node 245 goes higher, the transistor Q3 230 will conduct more weakly.

As the transistor Q3 230 conducts more weakly, the node 255 will be pulled down closer to ground by the transistor Q2 220. As the node 255 is pulled down lower, the voltage $V_{CL}$ at 235 will tend to go higher, away from ground potential $V_{CC}$. This in turn will cause transistor Q4 240 to either conduct more weakly or turn off all together, which implies that the node 245 will be pulled lower. As the node 245 goes lower, the transistor Q3 230 will conduct more strongly.

As the transistor Q3 230 conducts more strongly, the node 255 will be pulled up closer to $V_{CC}$ by the transistor Q3 230. As the node 255 is pulled up higher, the voltage $V_{CL}$ at 235 will tend to go lower, toward ground potential. This in turn will cause transistor Q4 240 to either turn on, or conduct more strongly if already on, which implies that the node 245 will be pulled higher. As the node 245 goes higher, the transistor Q3 230 will conduct more weakly.

The Clamping Circuit 112 of FIG. 3 will settle and achieve a relatively stable balancing point for the voltage $V_{CL}$ at the node 235. In an exemplary embodiment, assuming that the transistor Q4 240 is strong compared to the Resistor 280, then the difference between $V_{CC}$ and $V_{CL}$ will be approximately equal to the clamping voltage $V_{clamp}$ which is in turn defined as the absolute value of the threshold voltage $V_{tp4}$ of Q4 240:

$$V_{CC}-V_{CL}=V_{clamp}=|V_{tp4}|$$

$$V_{CL}=V_{CC}-V_{clamp}=V_{CC}-|V_{tp4}|$$

Exemplary values for a presently preferred embodiment that achieves this result are presented in Table 1.

General Formulation

In achieving the result for Case III, the Clamping Circuit 112 of FIG. 3 provides a smaller voltage swing to be boosted by the Boosting Circuit 110 of FIG. 2.

It should be understood that in preferred embodiments a clamping circuit such as the Clamping Circuit 112 performs as a balancing circuit. The clamping circuit provides voltage clamping functionality to a boosting circuit such as the Boosting Circuit 110. More particularly, the balancing circuit provides a voltage such as $V_{CL}$ to the boosting circuit to reduce or decrease the voltage available for boosting, that is, the available voltage swing for boosting. Preferably, a voltage such as $V_{CL}$ is provided at all times to the boosting circuit, although this voltage will be at approximately ground potential or, more particularly, at approximately zero volts when the supply voltage (referred to as $V_{CC}$ in the embodiments presented herein) is less than a certain value, such as a clamping voltage such as $V_{clamp}$. When the supply voltage (such as $V_{CC}$) is greater than the certain value (i.e., such as $V_{clamp}$), the voltage such as VCL that is presented to the boosting circuit will be approximately or substantially greater than zero and will decrease the voltage available for boosting, thus limiting or clamping the value of the boost voltage.

Figure 4:
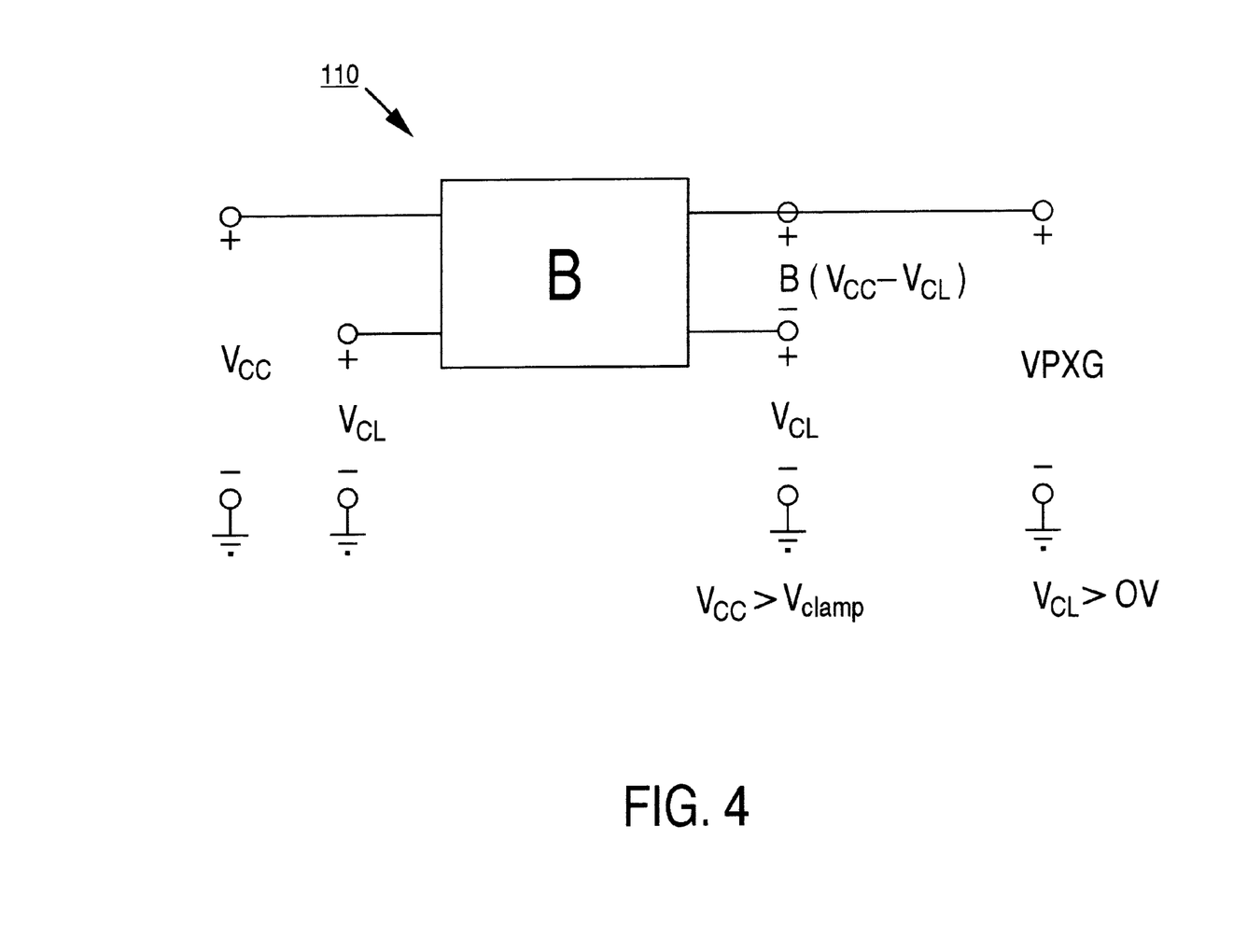
FIG. 4 is a block diagram of a generalized voltage boosting circuit of the present embodiment with a voltage clamping input.
Figure 5:
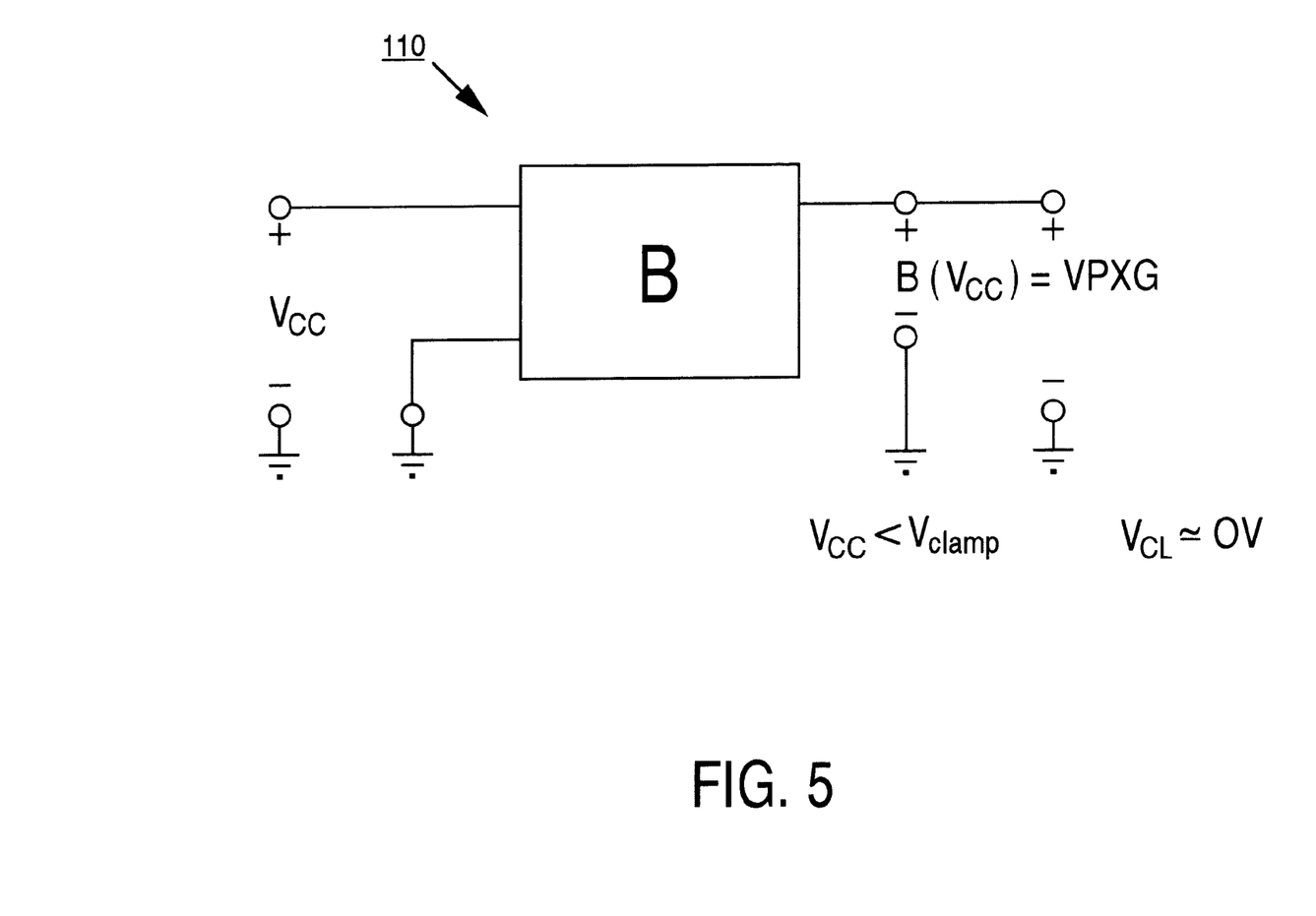
FIG. 5 is a block diagram of the generalized voltage boosting circuit of the present embodiment with the voltage clamping input held to zero.

FIGS. 4 and 5 are block diagrams illustrating a generalized and simplified embodiment of voltage Boosting Circuit 110 with a voltage clamping input. The Boosting Circuit 110 embodiment has an effective Boost Ratio of B. In a exemplary embodiment, the Boosting Circuit 110 embodiment is a multi-stage voltage booster with N stages. Preferably, the number of stages N is more than one and less than five.

As illustrated in FIG. 4, a supply voltage $V_{CC}$ as well as a voltage $V_{CL}$ are presented to the input side of the simplified Boosting Circuit 110 embodiment. The voltage to be boosted by the simplified Boosting Circuit 110 embodiment is $V_{CC}-V_{CL}$, which is a reduced voltage compared to the simplified boosting circuit 50 of FIG. 1 (i.e., $V_{CC}-0$, or $V_{CC}$).

By way of explanation, consider that instead of a voltage swing from ground potential (0 V) to $V_{CC}$ that always encounters an effective Boost Ratio B in the voltage boosting circuit 50 of FIG. 1 as follows:

$$VPXG = V_{CC}*B$$

which can be written as to illustrate the full voltage swing:

$$VPXG = ((V_{CC}-0)*B)+0;$$

the Clamping Circuit 112 provides a smaller voltage swing of $V_{CC}-V_{CL}$ to the simplified Boosting Circuit 110 embodiment of FIG. 4.

The voltage to be boosted, $V_{CC}-V_{CL}$, by the simplified Boosting Circuit 110 embodiment of FIG. 4 propagates through the Boosting Circuit 110 and is boosted by the effective Boost Ratio B, yielding a voltage $B*(V_{CC}-V_{CL})$ However, the voltage VCL that is not subject to the effective Boost Ratio B forms a component of the boosted voltage VPXG, which can be expressed in simplified terms as:

$$VPXG = (V_{CC}-V_{CL})*(B)+V_{CL}$$

While this relation will hold in general for the simplified Boosting Circuit 110 embodiment, it is more meaningful when $V_{CL}$ is greater than zero volts, which occurs when:

$$V_{CC} > V_{clamp} = |V_{tp4}|$$

i.e., Q4 240 of FIG. 3 is on (and ATD is high), and in this instance the boosted voltage VPXG can be written as the following:

$$VPXG = (V_{clamp})*(B)+V_{CC}-V_{clamp}$$

since $$V_{CL} = V_{CC}-V_{clamp}.$$

The case when $V_{CL}$ is approximately equal to zero volts or ground potential is illustrated in FIG. 5. The expression for the boosted voltage VPXG collapses to the case with no voltage clamping:

$$VPXG = (V_{CC}-0\ V)*(B)+0\ V = (V_{CC})*(B).$$

This will occur when:

$$V_{CC} < V_{clamp} = |V_{tp4}|$$

i.e., Q4 240 of FIG. 3 is off.

Figure 6:
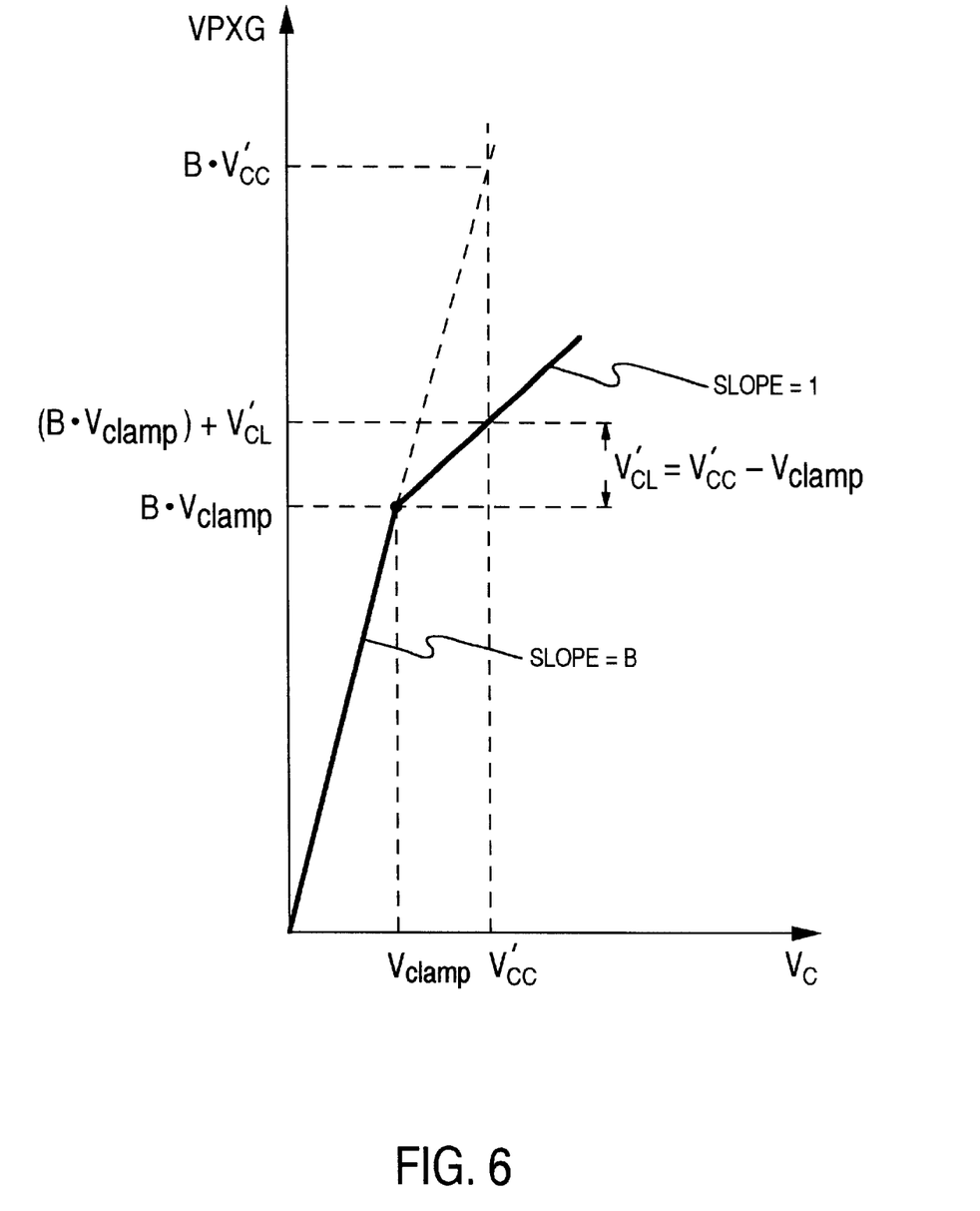
FIG. 6 is a figure illustrating a relationship according to the presently preferred embodiments.

FIG. 6 is a figure illustrating the relationship between $V_{CC}$ and VPXG for embodiments of the Boosting Circuit 110 and the Clamping Circuit 112 described herein. The graph is not drawn to scale and is intended to illustrate the change in the rate of growth of the boosted voltage VPXG as $V_{CC}$ increases beyond $V_{clamp}$ or falls below $V_{clamp}$.

Numerical Examples:

Table II presents a series of numerical examples, assuming the exemplary values of Table I (in particular a voltage $V_{clamp} = |V_{tp4}|$ of approximately −0.8 volts) and an effective Boost Ratio B of four for an embodiment of the Boosting Circuit 110 and the Clamping Circuit 112.

TABLE II

Numerical Examples for Exemplary Embodiments of the Boosting Circuit 110 of FIG. 2 and the Clamping Circuit 112 of FIG. 3.

| Supply Voltage $V_{cc}$ | Q4 240 of FIG. 3 | $V_{cc} <?> V_{clamp}$ [$V_{clamp}=|V_{tp4}|=$ −0.8 V] | $V_{CL}$ | VPXG (with clamping) | VPXG (no clamping) |
|---|---|---|---|---|---|
| 0.7 V | Off | $V_{cc}<V_{clamp}$ | 0 V | 2.8 V | 2.8 V |
| 0.8 V | On/Off | $V_{cc}<V_{clamp}$ | 0 V | 3.2 V | 3.2 V |
| 0.9 V | On | $V_{cc}>V_{clamp}$ | 0.1 V | 3.3 V | 3.6 V |
| 1.0 V | On | $V_{cc}>V_{clamp}$ | 0.2 V | 3.4 V | 4.0 V |
| 1.1 V | On | $V_{cc}>V_{clamp}$ | 0.3 V | 3.5 V | 4.4 V |
| 1.2 V | On | $V_{cc}>V_{clamp}$ | 0.4 V | 3.6 V | 4.8 V |
| 1.3 V | On | $V_{cc}>V_{clamp}$ | 0.5 V | 3.7 V | 5.2 V |

As shown in Table I, if $V_{CC}$ is equal to 0.7 volts, Q4 240 is off and $V_{CC}$ is less than $V_{clamp}$ and the voltage $V_{CL}$ is approximately 0 V. The boosted voltage VPXG is:

$$VPXG = (0.7-0\ V)*(4)+0\ V = 2.8\ V.$$

If $V_{CC}$ is equal to 0.9 volts, Q4 240 is conducting and $V_{CC}$ is greater than $V_{clamp}$ and the voltage $V_{CL}$ is approximately 0.1 V. The boosted voltage VPXG is:

$$VPXG = (0.9-0.1\ V)*(4)+0.1\ V = 3.3\ V.$$

If $V_{CC}$ is equal to 1.1 volts, Q4 240 is conducting and $V_{CC}$ is greater than $V_{clamp}$ and the voltage $V_{CL}$ is approximately 0.3 V. The boosted voltage VPXG is:

$$VPXG = (1.1-0.3\ V)*(4)+0.3\ V = 3.5\ V.$$

For an numerical example with reference to FIG. 6, assuming a supply voltage $V_{CC}=V_{CC}'$ equal to 1.3 volts, then in the Clamping Circuit 112 Q4 240 is conducting and $V_{CC}=V_{CC}'$ is greater than $V_{clamp}$ and the voltage $V_{CL}=V_{CL}'$ is approximately 0.5 V. The clamped boosted voltage VPXG is:

$$VPXG=(B*V_{clamp})+V_{CL}'=(4*0.8\ V)+0.5\ V=3.7\ V.$$

Similarly, with no clamping circuit, the boosted voltage VPXG would be $$VPXG=(B*V_{CC}')=(4*1.3\ V)=5.2\ V.$$

Assume that in this embodiment a boosted voltage VPXG of 3.2 volts provides a sufficient word line voltage access a core cell, and further that a VPXG of over 4.0 provides a word line voltage that is too high for the core cell sensing circuitry. In this example, the non-clamped VPXG (at 5.2 V) is far too high while the clamped VPXG (at 3.7 V) is within acceptable bounds for accessing and allowing proper sensing of the core cell.

From the foregoing, it can be seen that the presently preferred embodiments provide a balancing or voltage clamping circuit for a flash memory. A voltage boost circuit for a flash memory includes a boosting circuit, which is capable of boosting a portion of a power supply voltage of the flash memory to a word line voltage level adequate for accessing a core cell in a core cell array of the memory. The voltage boost circuit further includes a balancing or clamping circuit for providing a nonzero adjustment voltage to the boosting circuit to reduce the portion of the supply voltage that is available for boosting by the boosting circuit when the power supply voltage exceeds a certain value.

While a particular embodiment of the present invention has been shown and described, modifications may be made. For example, the sense of the individual transistors, p-channel and n-channel, may be reversed in suitable applications. Further, the inventive concepts described herein may be applied to circuits other than memory devices. It is therefore intended in the appended claims to cover all such changes and modifications which fall within the true spirit and scope of the invention.

We claim:

1. A voltage boost circuit for a flash memory, the voltage boost circuit comprising:
    a boosting circuit to boost a portion of a power supply voltage of the flash memory to a word line voltage level adequate to access a core cell of the memory;
    a balancing circuit to provide a nonzero adjustment voltage to said boosting circuit to reduce the portion of the supply voltage that is available for boosting by said boosting circuit when the power supply voltage exceeds a certain value;
    a first transistor included in said balancing circuit having a threshold voltage that serves as a clamping voltage; and
    pull up and pull down transistors coupled to the said first transistor to stabilize said feedback loop to provide a stable voltage to the boosting circuit, wherein the stable voltage reduces the portion of the power supply voltage that is available for boosting by the boosting circuit.

2. A voltage clamping circuit for a memory for use in conjunction with a voltage boost circuit for boosting a power supply voltage, the voltage clamping circuit comprising:
    a feedback loop, wherein said feedback loop further comprises:
        a first transistor having a threshold voltage that serves as a clamping voltage; and
        pull up and pull down transistors coupled to the said first transistor to stabilize said feedback loop to provide a stable voltage to the voltage boost circuit, wherein the stable voltage reduces the portion of the power supply voltage that is available for boosting by the voltage boost circuit.

3. The voltage clamping circuit according to claim 2 further comprising:
    one or more transistors utilized as switches and connected to said feedback loop to enable operation of said voltage clamping circuit during a core memory cell address transition.

4. A voltage boost circuit for a memory, the voltage boost circuit comprising:
    a boosting circuit coupled to a boosted node to boost a word line voltage to access a core cell of the memory; and
    a clamping circuit coupled to said boosting circuit, wherein said clamping circuit comprises:
        a threshold voltage clamping transistor to clamp the boosted node to a desired voltage; and
        pull up and pull down transistors coupled to the said threshold voltage clamping transistor to provide a stable voltage to the boosting circuit, wherein the stable voltage reduces the portion of a power supply voltage that is available for boosting by the boosting circuit.

5. The voltage boost circuit according to claim 4 wherein the clamping circuit further comprises:
    a resistor; and
    an inverter device coupled to said boosting circuit and said threshold voltage clamping transistor, wherein said inverter device comprises a pair of transistors; and
    a switching device coupled to said inverter device, wherein the switching device is controlled by said resistor and said threshold voltage clamping transistor.

6. The voltage boost circuit according to claim 4 wherein the clamping circuit is configured to respond to address changes of the memory to control the clamping of the boosted node.

7. A memory comprising:
    a core cell array;
    an address decoder configured to activate one or more word lines of a plurality of word lines, wherein each word line of the plurality of word lines is associated with one row of the core cell array;
    a boosting circuit configured to boost a portion of a power supply voltage of the memory to produce a boosted voltage on a boosted node coupled to the address decoder, the address decoder responding to the boosted voltage by boosting the word line voltage of one of the one or more word lines upon activation to a boosted voltage suitable to access a core cell of the core cell array; and
    a balancing circuit coupled to said boosting circuit to provide a nonzero adjustment voltage to said boosting circuit to reduce the portion of the power supply voltage that is available for boosting by said boosting circuit when the power supply voltage exceeds a certain value, the balancing circuit further including pull up and pull down transistors coupled to a threshold voltage clamping transistor to provide said nonzero adjustment voltage to the boosting circuit.

8. In a memory, a method of clamping a boost voltage to an acceptable level, comprising:

generating an adjustment voltage with a balancing circuit; and boosting a portion of a power supply voltage of the memory to a boost voltage with a voltage boost circuit; and clamping the boost voltage to an acceptable level by utilizing the adjustment voltage to reduce the portion of the power supply voltage that is available for boosting.

9. The method according to claim 8 wherein the generating is performed in response to a transition of one or more address inputs of the memory.

10. The method according to claim 8 further comprising:

accessing a core cell of the memory utilizing the boost voltage.

11. A voltage boost circuit for a memory comprising:

means for boosting a portion of a supply voltage of the memory to a boost voltage;

means for generating an adjustment voltage; and means for clamping the boost voltage utilizing the adjustment voltage.

12. The voltage boost circuit according to claim 11, further comprising:

means for detecting a transition of one or more address inputs of the memory.

13. The voltage boost circuit according to claim 11, further comprising:

means for accessing a core cell of the memory utilizing the boost voltage.

* * * * *